US 6,812,738 B1

(12) United States Patent
Dante et al.

(10) Patent No.: US 6,812,738 B1
(45) Date of Patent: Nov. 2, 2004

(54) VECTOR ROUTING IN A PROGRAMMABLE LOGIC DEVICE

(75) Inventors: Conrad Dante, Portland, OR (US); David Lee Rutledge, Newberg, OR (US); David J. Wicker, Jr., Hillsboro, OR (US)

(73) Assignee: Lattice Semiconductor Corp., Hillsboro, OR (US)

( * ) Notice: Subject to any disclaimer, the term of this patent is extended or adjusted under 35 U.S.C. 154(b) by 45 days.

(21) Appl. No.: 10/255,656

(22) Filed: Sep. 25, 2002

Related U.S. Application Data

(63) Continuation-in-part of application No. 10/187,236, filed on Jun. 28, 2002.

(51) Int. Cl.⁷ .......................................... H03K 19/177
(52) U.S. Cl. .............................. 326/41; 326/38; 326/39
(58) Field of Search ................................ 326/37–41, 47

(56) References Cited

U.S. PATENT DOCUMENTS

| | | |
|---|---|---|
| 4,642,487 A | 2/1987 | Carter |
| 4,706,216 A | 11/1987 | Carter |
| 4,758,985 A | 7/1988 | Carter |
| 5,197,065 A | 3/1993 | Calvignac et al. |
| 5,295,137 A | 3/1994 | Jurkevich |
| 5,754,459 A | 5/1998 | Telikepalli |
| 6,023,742 A | 2/2000 | Ebeling et al. |
| 6,262,908 B1 * | 7/2001 | Marshall et al. ............... 365/63 |
| 6,275,491 B1 | 8/2001 | Prasad et al. |
| 6,289,097 B1 | 9/2001 | Gregory et al. |
| 6,362,650 B1 | 3/2002 | New et al. |
| 6,363,319 B1 | 3/2002 | Hsu |
| 6,538,470 B1 | 3/2003 | Langhammer et al. |
| 2002/0089348 A1 | 7/2002 | Langhammer |

OTHER PUBLICATIONS

J.C. Alves et al., "RVC—A Reconfigurable Coprocessor for Vector Processing Applications", IEEE Com. Soc., pp. 258–259 (1998).

"Stratix: Programmable Logic Device Family," Altera Corporation, Aug. 2002, Ver. 2.1 Data Sheet.

"Silicon," Xilinx Products website, http://www.xilinx.c m/xlnx/xil_pr dc t_pr duct.jsp?title+silic n, printed Sep. 16, 2002, 3 pages.

Chameleon Systems —Your Communication Platform: from website www.chameleonsystems.com, 5 pages, no date.

(List continued on next page.)

Primary Examiner—Anh Q. Tran

(57) ABSTRACT

A PLD is disclosed that uses vector routing between components. A vector routing path is coupled between the components and includes a group of wires for routing a group of bits as one vector so that all bits in the vector are switched at once and as a group by a single set of control signals. Vector switch boxes are used to switch entire vectors of a predetermined bit width and a fixed-bit order. The vector routing may be between components in a vector domain, within vector-based components, or between components in a PLD domain and a vector domain. The vector routing path may allow for time-division multiplexing. For example, different components may use the same vector routing path during different time slices. The vector routing path may be dynamically segmented. Dynamic segmentation allows different portions of the same vector routing path to be used simultaneously by different components. A component may be coupled to multiple vector routing paths through a multiplexer. Consequently, the multiplexer may be dynamically switched such that the component receives information from different component sources.

27 Claims, 12 Drawing Sheets

OTHER PUBLICATIONS

"Tool suite supports reconfigurable processor" article by Richard Goering; published in *EE Times* on Aug. 14, 2001, 6 pages.

Xilinx Home; Virtex–II Pro Platform FPGAs; The Platform for Programmable Systems; from website www.xilinx.com, 3 pages, no date.

Xilinx Home; PowerPC Embedded Processor Solution; from website www.xilinx.com, 2 pages, no date.

Xilinx Home; The First Platform FPGA Solution; from website www.xilinx.com, 2 pages, no date.

Xilinx Home; Virtex–II Platform FPGA Features; from website www.xilinx.com, 3 pages, no date.

QuickLogic Home; QuickRAM, Dual–Port Embedded RAM for Extremely High Performance Functions; from website www.quicklogic.com, 3 pages, no date.

QuickLogic Home: QuickDSP, Embedded DSP Building Blocks for High–Performance, Complex DSP Designs; from website www.quicklogic.com, 2 pages, no date.

QuickLogic Home; Eclipse, High Performance FPGAs with Enhanced Logic Supercell; from website www.quicklogic.com, 3 pages, no date.

"Re–configurable High Speed Arithmetic Functions in a Non–Volatile FPGA", written by Rufino T. Olay III, Customer Engineer at QuickLogic, 6 pages, no date.

High Performance Multipliers in QuickLogic FPGAs, written by John Birkner, Jim Jian and Kevin Smith of QuickLogic, 9 pages, no date.

\* cited by examiner

PRIOR ART BIT-BASED SWITCH BOX

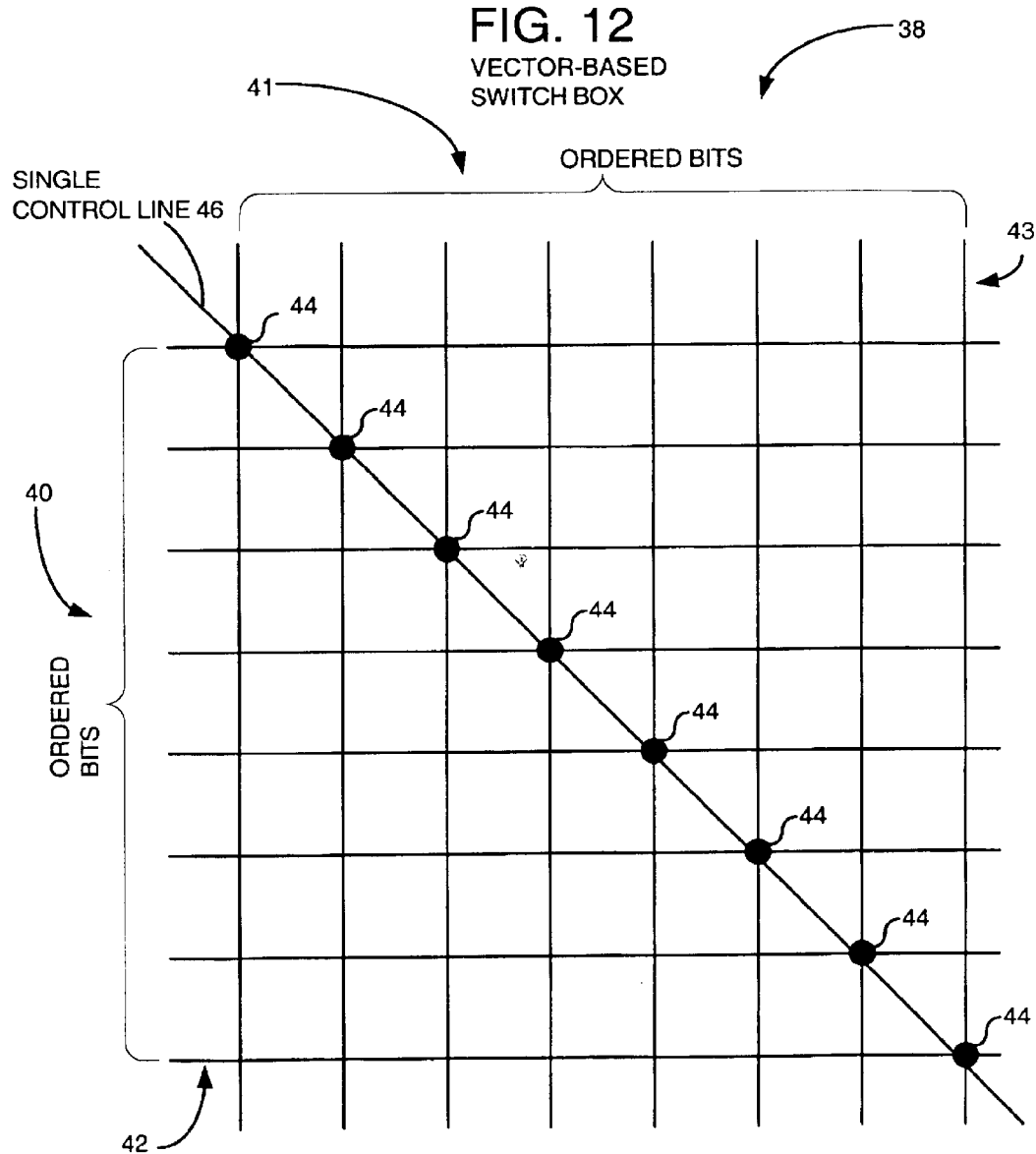

VECTOR ROUTING IN A PROGRAMMABLE LOGIC DEVICE

RELATED APPLICATION DATA

This application is a continuation-in-part of application No. 10/187,236, filed Jun. 28, 2002.

TECHNICAL FIELD

The present invention relates to programmable circuits. More particularly, the present invention relates to routing of data in a programmable logic device.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

One type of PLD is known as a Field-Programrnable Gate Array (FPGA). An FPGA is a general purpose device that can be programmed by an end user to perform one or more selected functions. An FPGA typically includes an array of individually programmable logic cells (PLCs), each of which is programmably interconnected to other PLCs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device, such as SRAM, EPROM, EEPROM, anti-fused, fused, or other, is provided in the FPGA device so as to be at least once-programmable by device users for defining user-provided configuration information. Static Random Access Memory or SRAM is a form of reprogrammable memory that may be differently programmed many times. Electrically Erasable programmable ROM or EEPROM is another example of nonvolatile reprogrammable memory. The configurable memory of an FPGA device may be formed of a mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations or they may be configurable in accordance with user-provided configuration information.

(3) PLCs are provided for carrying out user-programmed logic functions (e.g., logic gates) as defined by user-provided configuration information. Typically, each of the many PLCs of an FPGA has at least one lookup table (LUT) that is user-configurable to define any desired truth table. A PLC may have other resources such as LUT input signal pre-processing resources and LUT output signal post-processing resources.

(4) An interconnect network is provided for carrying signal traffic within the FPGA device between various PLCs and/or between various IOBs and/or between various IOBs and PLCs. At least part of the interconnect network is typically configurable so as to allow for programmably-defined routing of signals between various PLCs and/or IOBs in accordance with user-defined routing information.

A basic FPGA structure is shown in FIG. 9. This basic structure is repeated over and over within the FPGA. PLCs 2 are used to program logic into the FPGA. The interconnect network is formed by switch boxes 3 and routes 5, which are represented generically by three lines, but may be any number. FIG. 10 is a more detailed illustration of the switch box. For the 8×8 switch box, there are sixty-four switches, shown generally at 6. Each switch is separately controlled as indicated by control signals labeled "C". Unordered bits on one port 7 of the switch are coupled to unordered bits on another port 8 as directed by the control signals. Thus, one characteristic of such current-generation FPGAs is the ability to deliver a very flexible set of logic resources and signal routing resources, such that the end-user can implement nearly any arbitrary logic function.

The evolution of FPGAs from thousands to millions of gates has enabled system-level integration on an FPGA. This level of integration has led to the need to implement a wide variety of very complex functions on FPGAs. Among these more complex functions are a class of functions known as "datapath" functions that are typically characterized by data that is processed in byte-wide or word-wide manner (e.g., 16 bits, 32 bits). Representative functions include 32-bit ADDERS and 16-bit×16-bit multipliers. For example, U.S. Pat. No. 5,754,459, issued May 19, 1998 to Telikepalli, teaches implementing a multiplier circuit using a number of PLCs in an FPGA architecture. Such functions are typically important in performing Digital Signal Processing (DSP) operations, which are becoming more common in FPGA-based designs.

The data used in DSP operations has the characteristic of being a wide bit-width and a fixed-bit order because the relationship of each bit is maintained for all processing steps. Unfortunately, the architectural flexibility of current FPGAs has become a weakness for implementing DSP functions. For example, the large amount of switches and control signals is inefficient and expensive when implementing wide bit-width and fixed-bit order needed for DSP operations.

Thus, it is desirable to provide a programmable device that can efficiently handle wide bit-width and/or fixed-bit ordered data.

SUMMARY

A PLD is disclosed that uses vector routing between components and vector switch boxes to programmably control the vector routing. A vector routing path is coupled between the components and includes a group of wires for routing a group of bits. The bits are routed as one vector so that all bits in the vector are switched at once and as a group by a single set of control signals. Indeed, a single control signal may be used to switch an entire vector routing path. Additionally, the ordering of the bits of the vector is maintained. The vector routing may be between components in a vector domain, within vector-based components, or between components in a PLD domain and a vector domain. The vector routing may be particularly beneficial in DSP operations, where the bit order is maintained through multiple steps.

In another aspect, the vector routing path may allow for time-division multiplexing. For example, different components may use the same vector routing path during different time slices.

In yet another aspect, the vector routing path may be dynamically segmented. Dynamic segmentation allows different portions of the same vector routing path to be used simultaneously by different components. For example, components A and B may communicate with each other via one segment of a vector routing path while two other components C and D communicate on another segment of the same vector routing path. The segmentation may then be dynamically changed.

In yet another aspect, a component may be coupled to multiple vector routing paths through a multiplexer. Consequently, the multiplexer may be dynamically switched such that the component receives information from different component sources.

These and other aspects will become apparent from the following detailed description, which makes references to the accompanying drawings.

BRIEF DESCRIPTION OF THE DRAWINGS

FIG. 12 is a representation of a switch box used in the vector-domain portion of the FPGA of FIG. 11.

DETAILED DESCRIPTION

Figure 1:
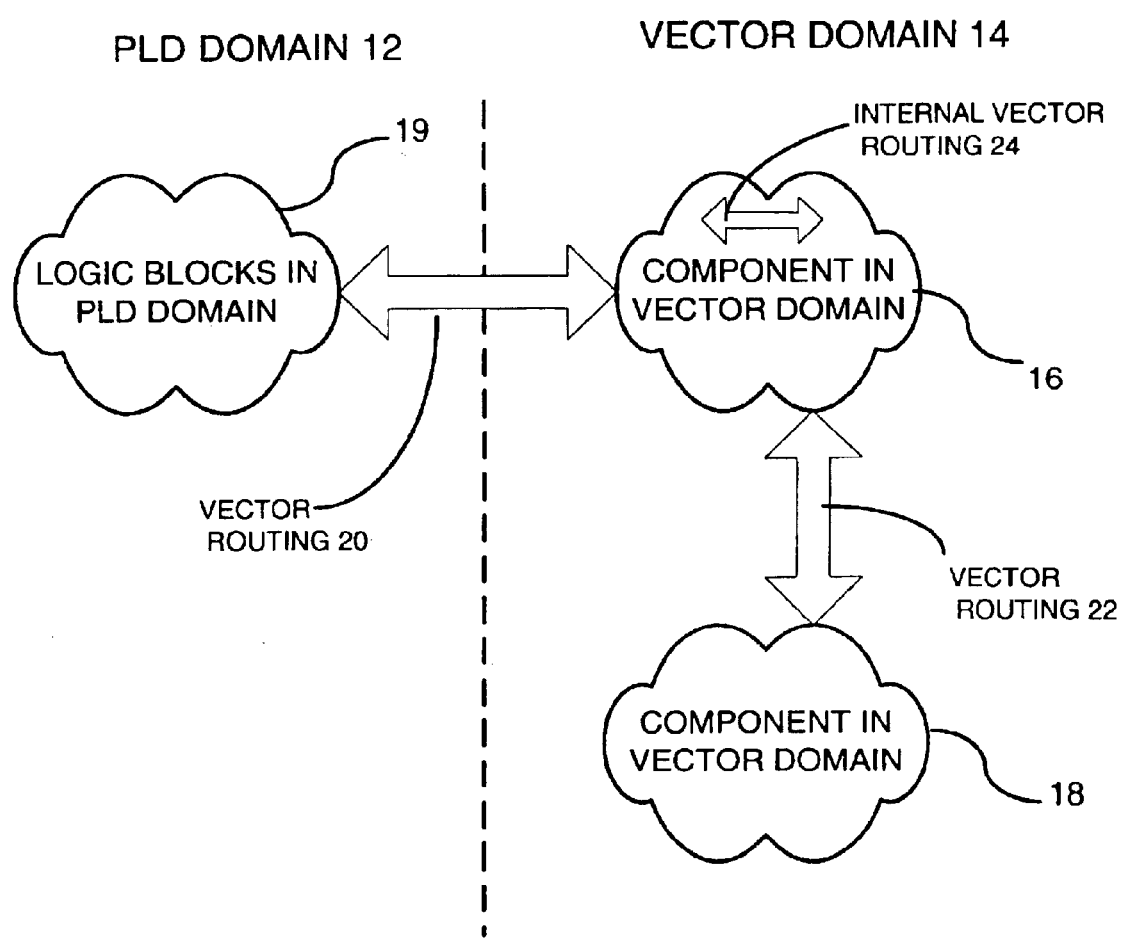
FIG. 1 shows a high-level diagram of vector routing in a programmable logic device.

FIG. 1 shows a high-level diagram illustrating vector routing in a programmable logic device (PLD) 10. The programmable logic device includes a PLD domain 12, and a vector domain 14. The vector domain is shown as including two vector components 16, 18, but any number of vector components may be used. A vector component includes any type of engine that performs a logical function (e.g., add, multiply, shift, etc.) on a vector. The PLD domain 12 typically includes an array of logic blocks 19 that are programmable to create user-defined functions. The PLD domain may include conventional fine-grain logic, memory and routing resources where signals are switched and routed on a bit-by-bit basis. Such bit-by-bit manipulation is termed unordered because routing software often routes the signals without constraints on path and/or placement in the PLD routing structure, which results in a somewhat disorganized ordering on a bit level. The vector domain 14 may include course-grain logic blocks that perform functions on wide bit-width digital words (e.g., 16, 32, 64 bits, etc). In the vector domain 14, bits associated with groups of wires are routed as one vector signal so that all bits in a digital word are controlled and switched at once and as a group. In the vector domain, ordering of the bits is maintained and the flexibility of the user to modify the ordering, as in traditional FPGAs, is eliminated in favor of efficiency. Thus, a vector represents binary data that is processed as a single unit in a datapath (as opposed to bit-oriented logic functions, such as a two-input NAND gate.) Vector processing is generally the act of processing a set of vector data. The characteristics of a vector is that it has a wide bit-width and a fixed-bit order. As shown generally at 20, communication between vector domain 14 and the PLD domain 12 occurs using vector routing. An interface (not shown) may also be used to convert from the ordered grouping of bits in the vector domain to the unordered bits in the PLD domain and vice versa. As shown generally at 22, vector routing may also occur between components in the vector domain. Additionally, vector routing may be used internally within a component as shown at 24 to route between engines within the component.

Figure 2:
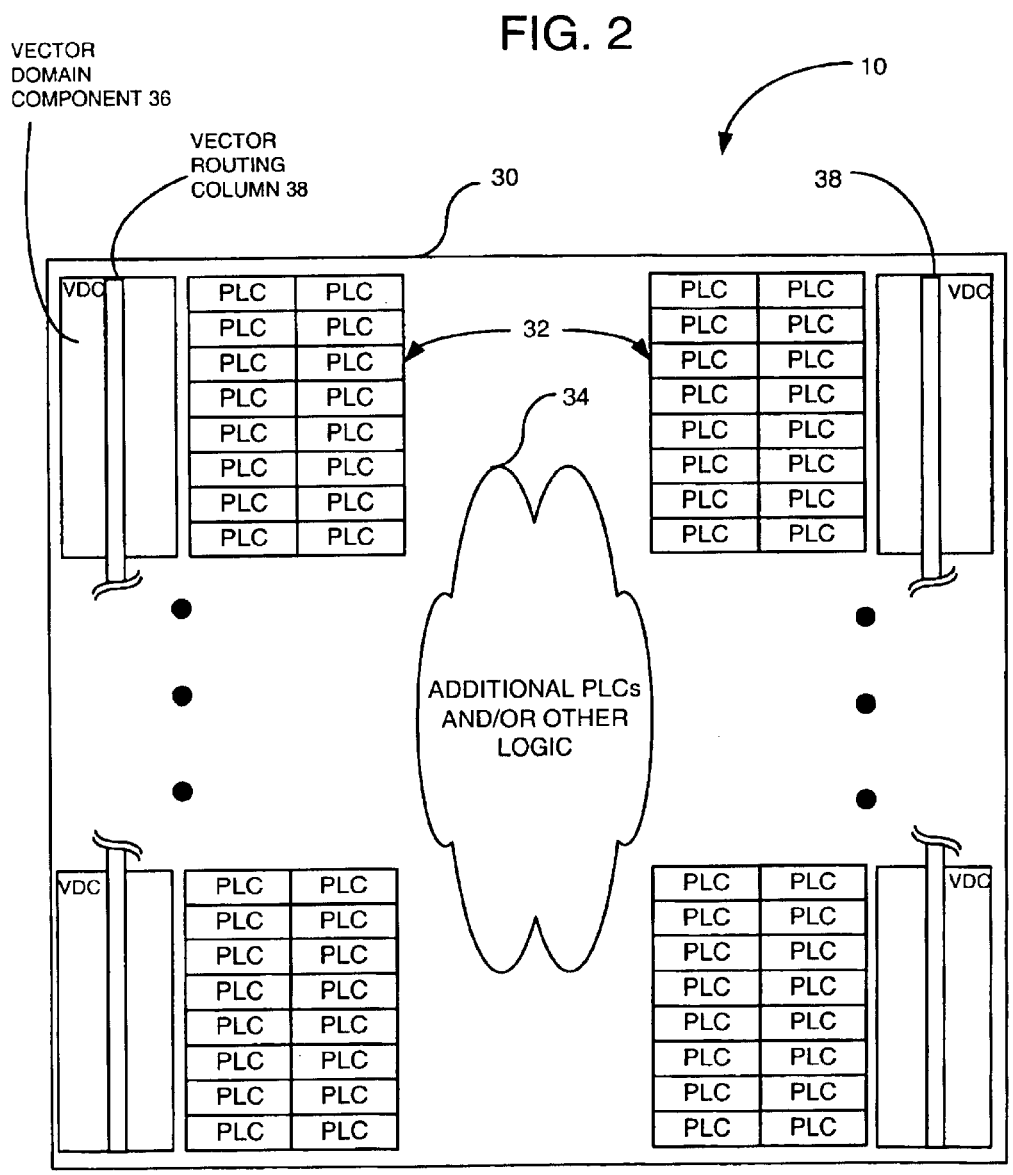
FIG. 2 is a block diagram showing a programmable logic device having multiple vector-domain components (VDCs) with vector routing paths extending between the components.

FIG. 2 shows a block diagram of the PLD 10 in greater detail. The PLD is housed in an outer package 30, which includes input and output pins (not shown). The PLD has multiple columns (i.e., an array) of programmable logic cells (PLC), as shown generally at 32. The number of columns of PLCs varies based on the design. As shown at 34, additional PLCs and/or other logic may also exist within the PLD. For example, other devices (e.g., memories, multipliers, etc.) may be included in logic 34. The PLD may be any of a variety of programmable devices that have a plurality of programmable logic blocks, such as PLCs. An example PLD is a field programmable gate array (FPGA). The illustrated PLD 10 includes one or more columns of vector-domain components, shown generally at 36. The vector-domain components may be engines that perform logic functions on vectors (add, multiply, etc.) or vector processing blocks (VPBs) that include multiple engines. Additionally, vector routing columns 38 include one or more vector routing paths (not shown in FIG. 2, but described further below) that allow for a dedicated communication channel between the vector-domain components. As further described below, the vector routing paths may be time-division multiplexed to allow multiple components to share the same routing paths. Additionally, the vector routing paths may be dynamically segmented. Finally, the vector routing paths may be coupled to a multiplexer to allow dynamic switching of sources fed to vector components.

Figure 11:
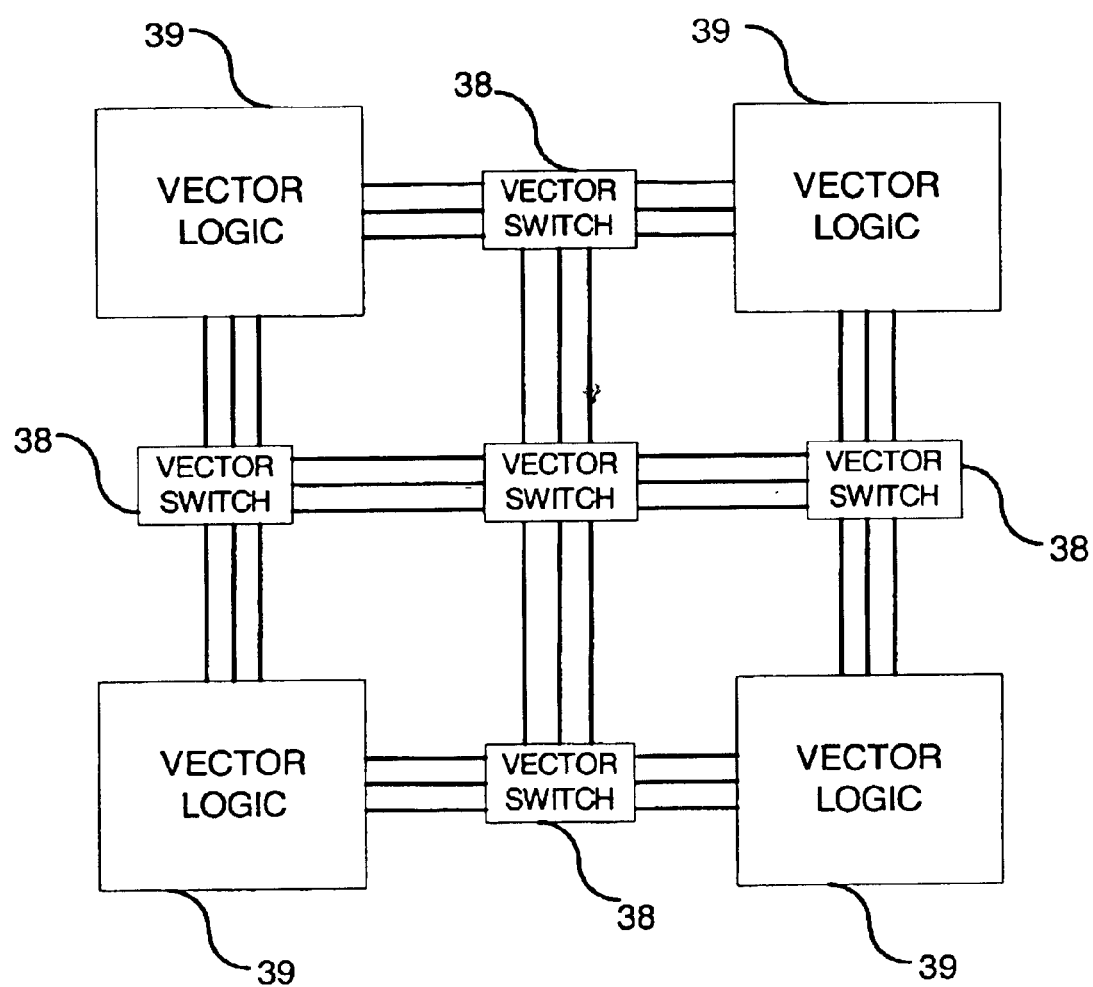
FIG. 11 is a representation of the vector-domain portion of an FPGA according to the present invention

Turning briefly to FIG. 11, a portion of the PLD is shown with vector switch boxes 38 used to route vectors between vector-based components 39. The vector-based components 39 are components that operate on data in a vector-wide manner, such as a 32-bit adder, a 16-bit multiplier, a VPB, etc. Routes between the vector switch boxes are shown generically as only 3 wires, but typically are 8, 16, 32 wires, etc. Using the vector switch boxes, ordered bits from one vector-based component are routed to another vector-based component with a substantially reduced set of control lines, while the bit order is maintained for the bits that make up the vector.

Figure 10:
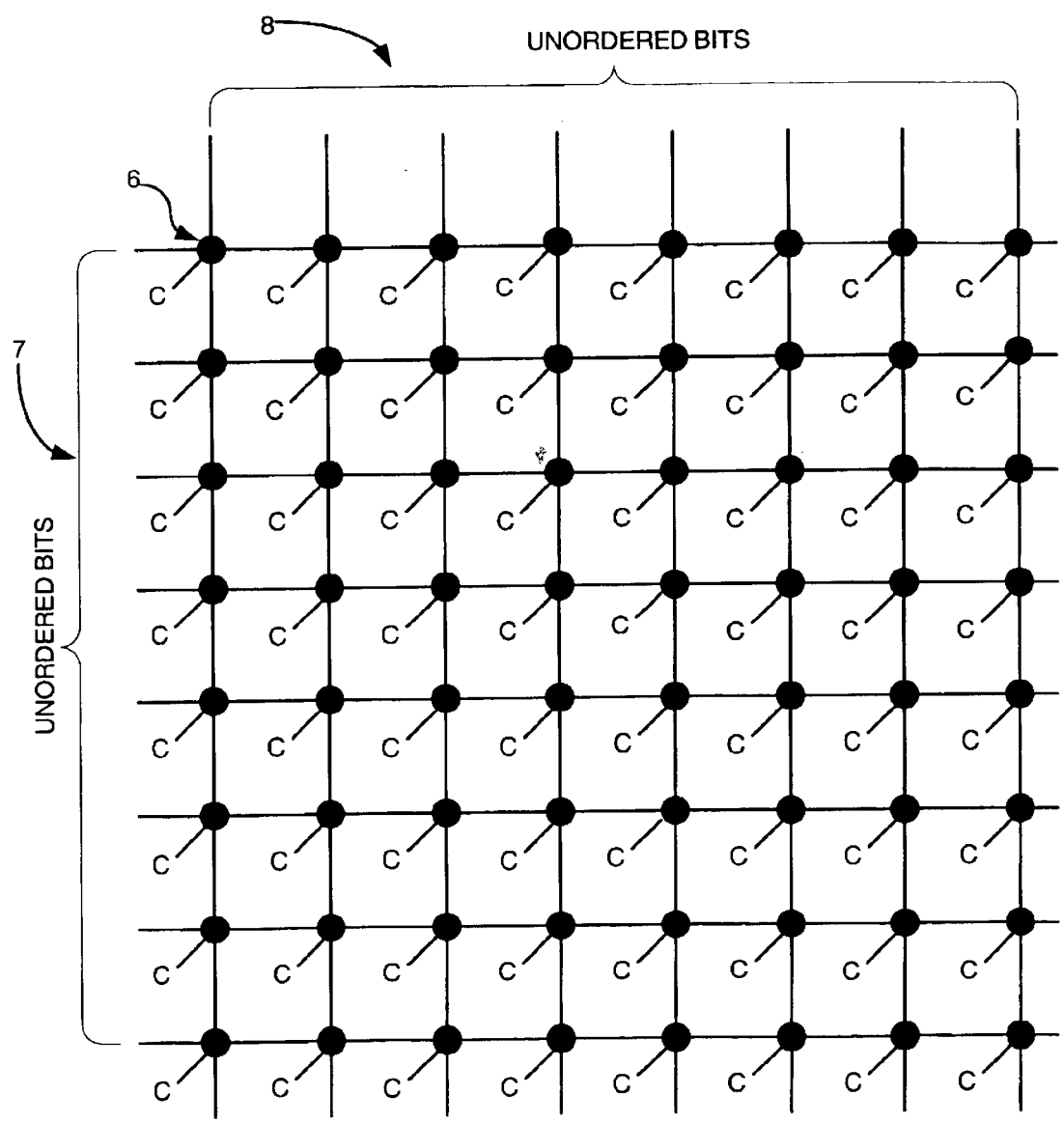
FIG. 10 is a prior art representation of a switch box used in the FPGA of FIG. 9.

FIG. 12 shows a vector switch box in more detail. The switch box 38 is used to couple a first port 40 with a second port 41 of the switch box. Other ports are also available on the switch box, but are not discussed for simplicity. The first port 40 has a set of conductors 42 extending in a horizontal direction. The second port has a second set of conductors 43 extending in the vertical direction. At the intersection of some of the first and second set of conductors are programmable switches, shown generically at 44. Only eight switches 44 are needed for an 8×8 switch box, instead of 64 switches as in the prior art (compare FIG. 10). The eight switches 44 are used to switch an entire vector between the first and second ports. Of course, other sizes of switch boxes may be used (e.g., 16×16, 32×32, 64×64, . . . ). Generally, the number of switches is equal to the width of a port. A set of control lines is used to switch the vector. In the particular example of FIG. 12, the set of control lines includes only a single control line 46, but additional control lines may be used. The control line switches the entire 8-bit vector associated with the ports, instead of having a separate control line for each switch. The vector is a predetermined width of 8 bits in the illustrated example and is not modifiable. Additionally, the ordering of the bits is predetermined and is also not modifiable. Although this reduces flexibility, fewer bits are needed to control the switches 44. Additionally, fewer switches are needed to route signals. Thus, with the vector switch boxes, less area (lower cost) and less signal loading (higher performance) is obtained.

Figure 3:
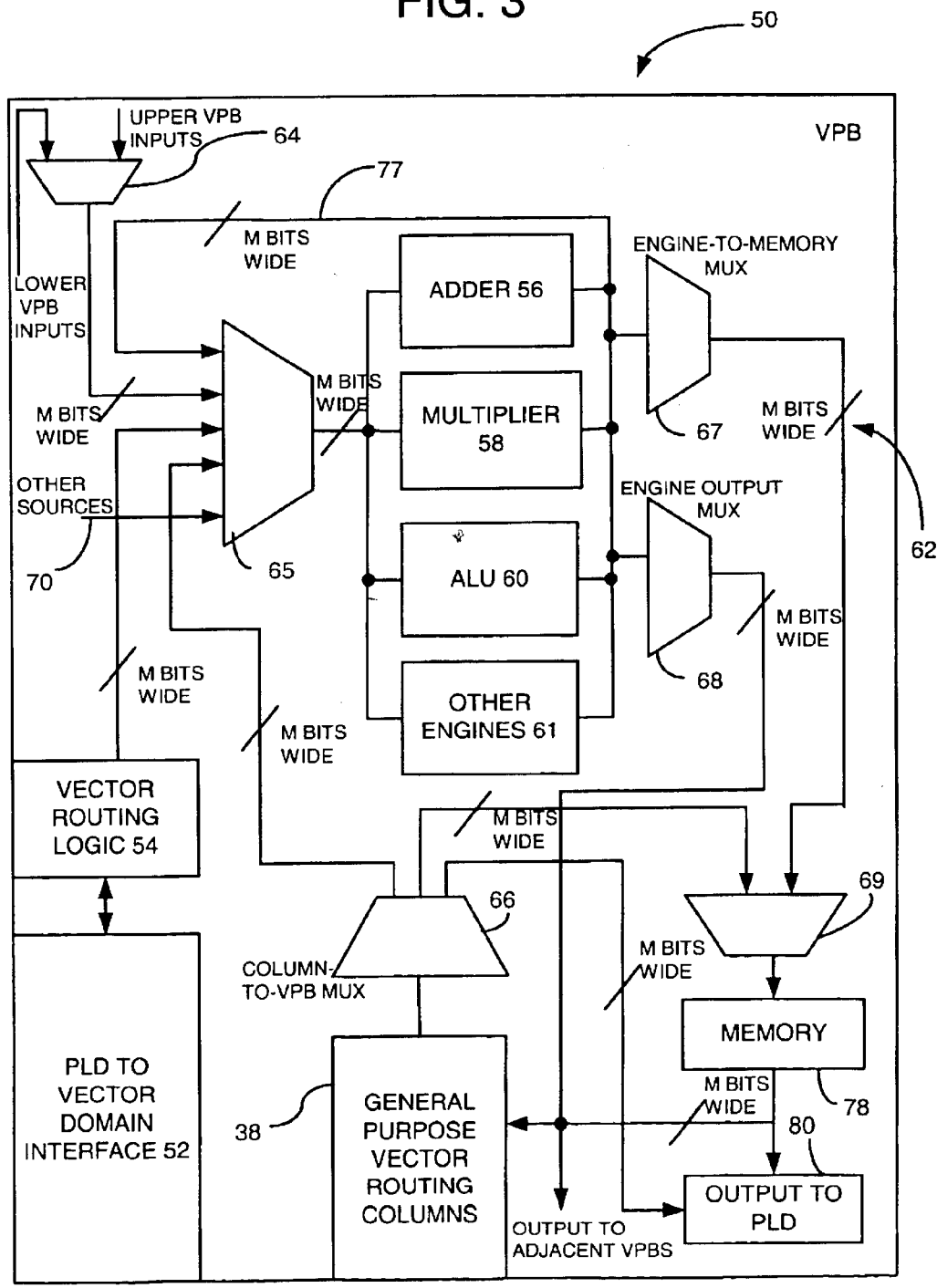
FIG. 3 is a high-level block diagram of an exemplary VDC of FIG. 2, known as a vector processing block (VPB), which includes vector routing columns.

FIG. 3 shows a more detailed diagram of a VPB 50. A PLD-to-vector-domain interface 52 receives inputs from the PLD domain and converts the inputs to vectors. Vector routing logic 54 is coupled to the interface 52 and facilitates routing to various components (i.e., engines) within the VPB. For example, the VPB may include one or more of the following engine components: adders (e.g., adder 56), multipliers (e.g., multiplier 58), ALUs (e.g., ALU 60), or other engines 61. Generally, VPB engines are specialized pipelined datapath units that perform functions of vector data, which would be especially expensive or difficult to accomplish with programmable logic cells (PLC). Vector routing paths that are M bits wide connect to engines and the supporting logic for the engines, such as shown at 62. Although the vector routing paths are "M bits wide", not every vector routing path is denoted as such to simplify the drawing. Multiplexers 64–69 switch entire vectors based on control signals (a number of techniques may be used to implement the control signals, including the use of decoders (not shown)). Specifically, multiplexer 64 provides additional routing paths to adjacent (upper and lower) VPBs. Based on control signals, either a vector from an upper VPB or a lower VPB is routed to multiplexer 65. Multiplexer 65 allows dynamic switching of multiple sources to the engines (e.g., 56, 58, 60, 61). For example, source vectors may be provided from adjacent VPBs, the PLD domain (via vector routing logic 54), any VPB coupled to a vector routing column 38, or vectors provided from the engines themselves (see feedback path 77). Other sources may also be provided into the multiplexer 65 as shown generally at 70. Thus, the engines 56, 58, 60, 61 may receive vectors from multiple sources and the sources may be dynamically switched via multiplexer 65. The output multiplexers 67, 68, from the engines route the resultant vectors to either memory 78 (via multiplexer 69), to the general purpose vector routing columns 38, or to the PLD domain via output 80. As further described below, the general purpose vector routing columns have one or more vector routing paths (M wires each) that allow multiple vector-domain components, such as VPBs, to communicate with each other in an efficient manner.

The particular VPB shown is not a general-purpose processor. It is an application-specific embedded processor that requires a relatively small program store and only communicates with dedicated internal resources. The embedded processor is not built from combinations of programmable logic blocks. Instead, it is made from logic that is designed for a specific classes of functions (e.g., multiply, add, etc.). Since the embedded processor is designed for a specific set of functions, it is built to perform these functions in a highly efficient manner through the use of specialized logic and extreme use of parallelization. By contrast, general processors use generalized logic resources and require large program stores and flexible interfaces to support a wide range of peripheral devices, such as keyboards, disk drives, printers and scanners.

Figure 4:
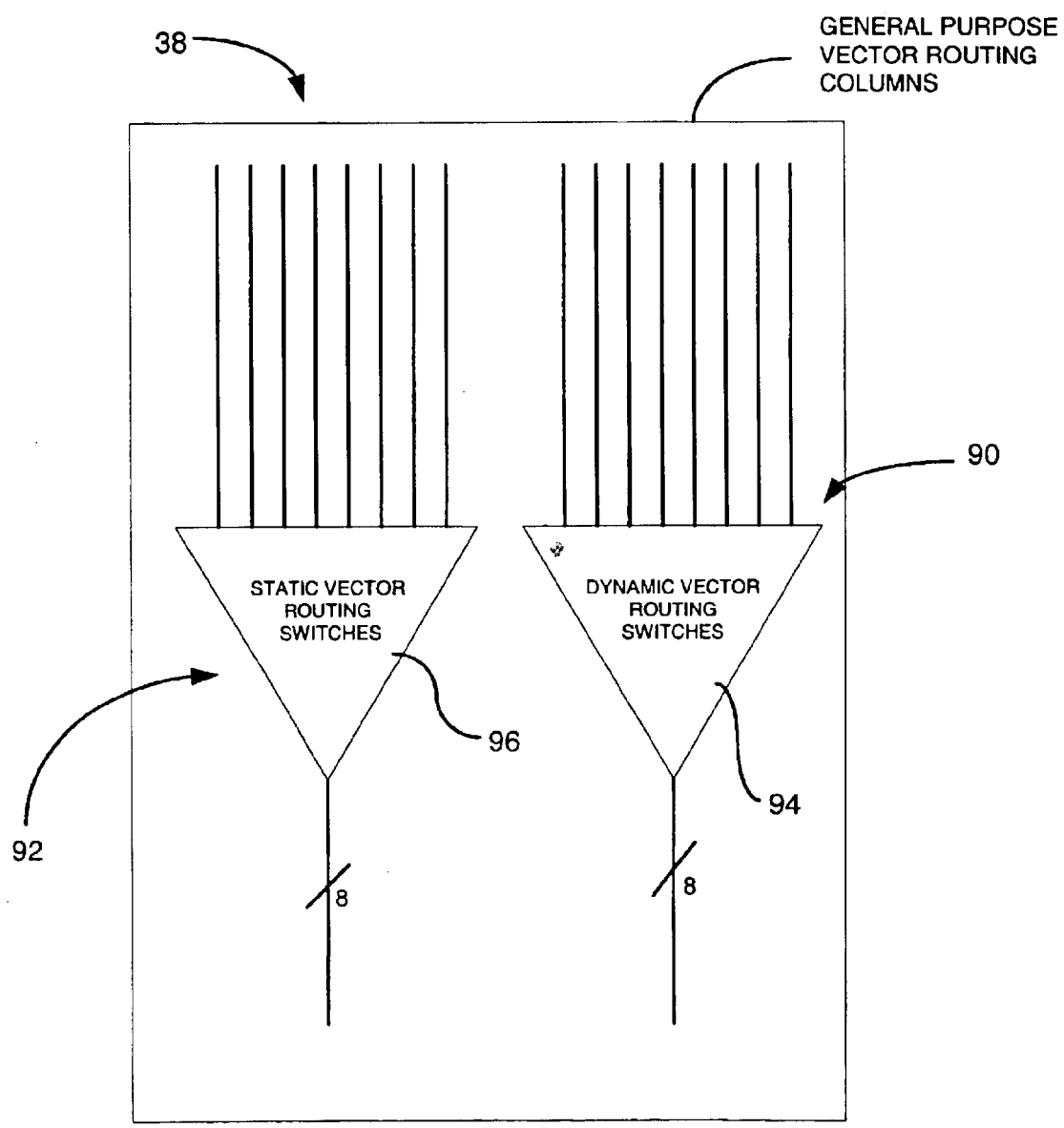
FIG. 4 is a high-level diagram of vector routing columns of FIG. 3 including static vector routing paths and dynamic vector routing paths.

FIG. 4 is a high-level block diagram of the vector routing columns 38. The illustrated routing columns include sixteen vector routing paths: eight dynamic vector routing paths (shown generally at 90) and eight static vector routing paths (shown generally at 92). A static routing path is one that is programmed one time and is not modified during the normal operation of the device. A dynamic routing path may be modified as part of the normal operation of the device. Those skilled in the art will recognize that any number of static and/or dynamic vector routing paths may be used to form the columns 38. Each vector routing path includes multiple bits (e.g., 8, 16, 32, 64, etc.). The dynamic vector routing paths are so named because they may be dynamically configured to allow time-division multiplexing through use of the dynamic routing switches 94. Additionally, the dynamic vector routing paths may be dynamically segmented. The static vector routing paths 92 are statically configured using fuses coupled to the static vector routing switches 96. The static vector routing switches are active repeater drivers that allow for static segmentation of the vector routing paths. Each of the dynamic and static vector routing switches 94, 96 is described further below in relation to FIGS. 7 and 8.

Figure 5:
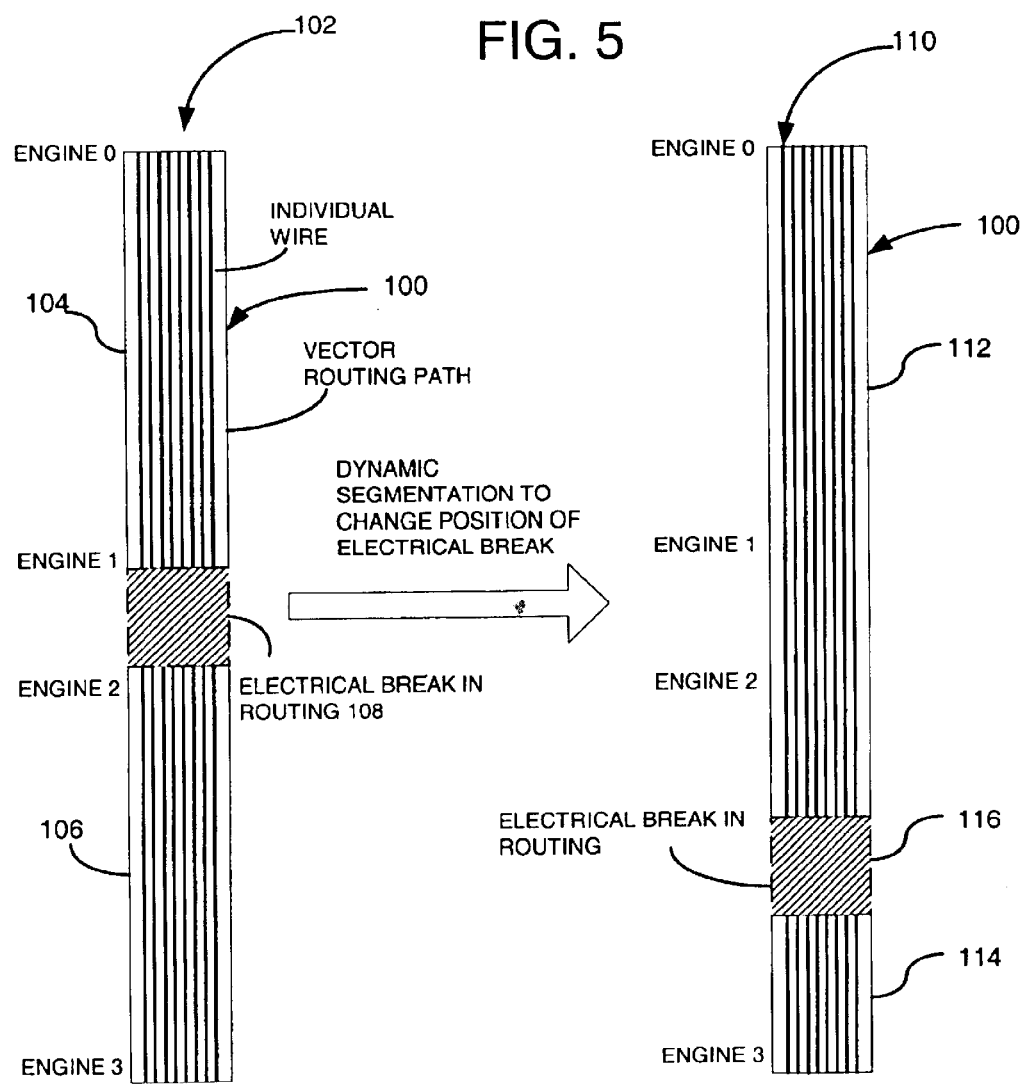
FIG. 5 shows dynamic segmentation of a vector routing path.

FIG. 5 is an illustration of dynamic segmentation that may occur in a vector routing path. A single vector routing path 100 from the vector routing column 38 is shown. The illustrated vector routing path has eight wires or conductors that form a vector. In the left-hand illustration 102 of the vector routing path, engines 0 and 1 may communicate on segment 104. At the same time, engines 2 and 3 may communicate on segment 106. Thus, multiple engines may carryout separate communications simultaneously on different segments of the same vector routing path 100. Such segmentation is facilitated via an electrical break in each wire between engines 1 and 2 in the vector routing path as shown at 108.

In the right-hand illustration 110 of FIG. 5, the same vector routing path 100 is dynamically re-segmented into segments 112, 114. On segment 112, engines 0, 1, and 2 may communicate together. On the lower segment 114, engine 3 may communicate with other engines (not shown) on the vector routing column 38 that are below engine 3. An electrical break 116 has been dynamically reconfigured in the vector routing path 100 to be between engines 2 and 3, instead of between engines 1 and 2. Thus, multiple wires in a vector routing path are dynamically segmented so that multiple portions of the vector routing path may be used simultaneously.

Figure 6:
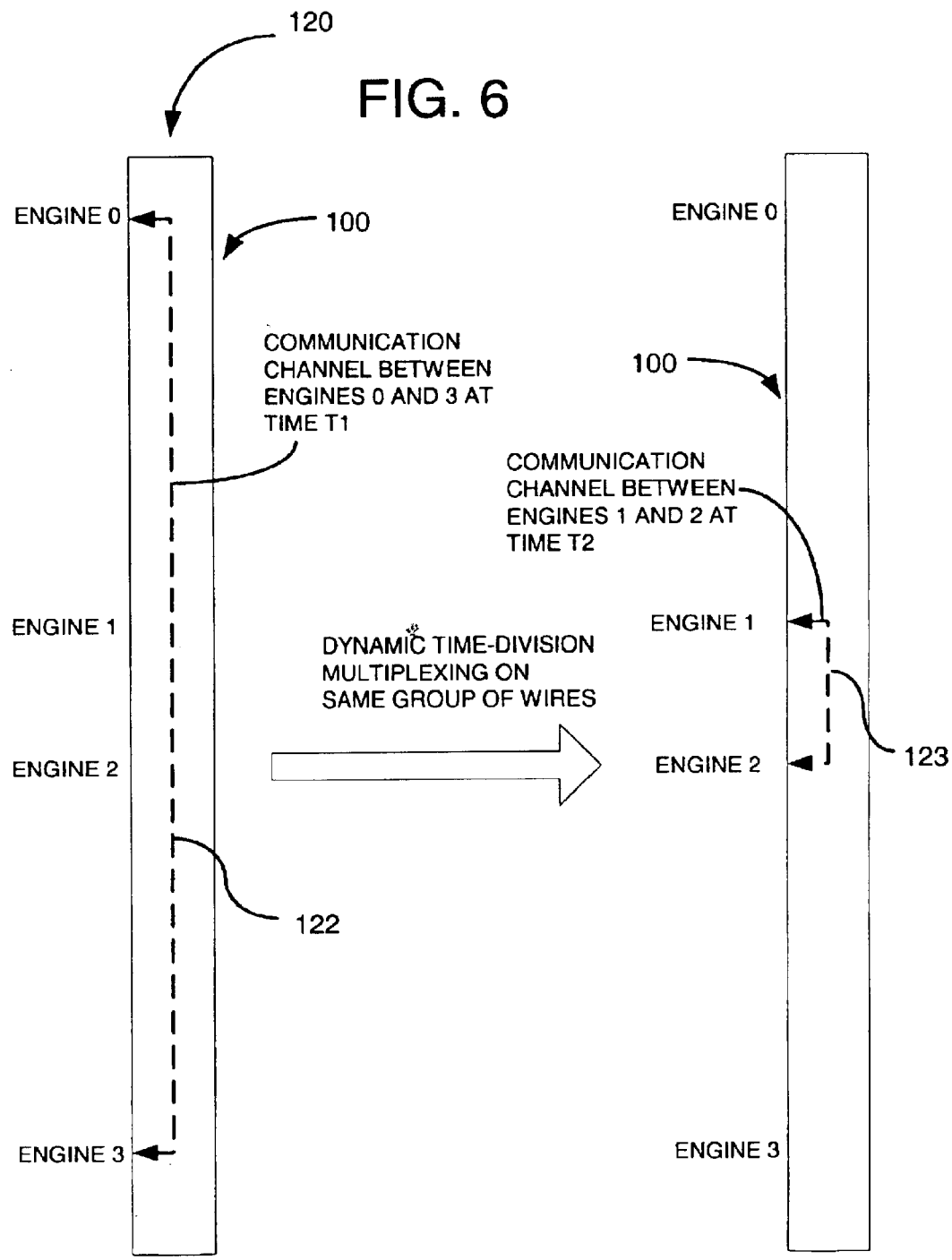
FIG. 6 shows time-division multiplexing of a vector routing path.

FIG. 6 illustrates how the vector routing path 100 may also be time-division multiplexed allowing multiple engines to share the same vector routing path. In the left-hand side 120 of FIG. 6, engines 0 and 3 communicate with each other during a first time slice T1 or first state as shown at 122. That is, engines 0 and 3 are in control of the vector routing path, whereas engines 1 and 2 do not drive the vector routing path 100. In a second time slice T2 or second state, engines 1 and 2 are in control of the vector routing path (as shown at 123) whereas engines 0 and 3 do not drive the vector routing path 100. Thus, four engines are sharing the same physical vector routing path rather than having separate vector routing paths: one to couple engines 0 and 3 and the other to couple engines 1 and 2. Thus, multiple vectors may be passed through a narrow channel using time-division multiplexing of a vector routing path.

Figure 7:
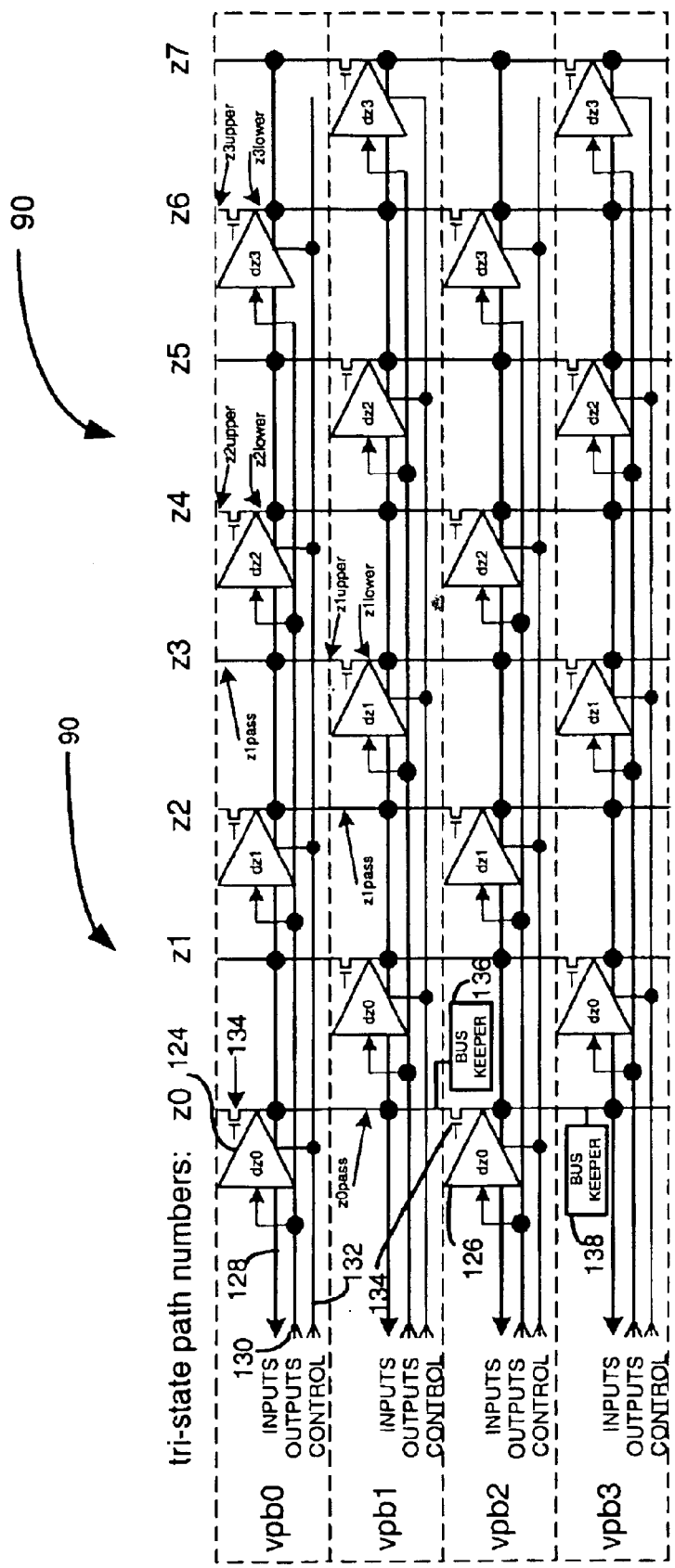
FIG. 7 is a detailed circuit diagram showing dynamic vector routing paths of FIG. 4.

FIG. 7 illustrates the dynamic vector routing column 90 having eight vector routing paths (labeled Z0–Z7). Although not shown, each vector routing path is a group of wires (8, 16, 32, . . . etc.) used to carry a vector signal. Additionally, for simplicity, only four VPBs (VPB0–VPB4) are shown coupled to the vector routing column. Each vector routing path has multiple tristate gates associated with it. For example, vector routing path Z0 has tristate gates 124, 126 coupled thereto. Through any of the vector routing paths Z0–Z7, VPB0 receives a vector input 128, provides a vector output 130, and provides control signals 132 to drive the appropriate vector routing path. Similarly, VPB1-VPB3 may receive and output vectors from each of the vector routing paths. The tristate gates, such as 124, 126, allow for time-division multiplexing of the vector routing paths. For example, during a first time slice, VPB0 may turn on tristate gate 124 via controls 132 to communicate with VPB1, while VPB2 controls turn off its associated tristate gate 126. During a second period of time, VPB2 may turn on tristate gate 126 to communicate with VPB1, while VPB0 turns off its tristate gate 124. Thus, the tristate gates allow for time-division multiplexing of the vector routing paths.

The vector routing paths also have pass gates, shown generally at 134. The pass gates allow for dynamic segmentation of the vector routing paths as explained in relation to FIG. 5. Thus, electrical breaks may be dynamically made in the vector routing paths to accommodate dynamic segmentation. Bus keepers 136, 138 may be coupled to the segments in order to maintain voltage levels on the vector routing paths with tristate drivers off. Only two bus keepers are shown so as not to unduly clutter the figure, but additional bus keepers are typically used for each vector routing path segment.

Figure 8:
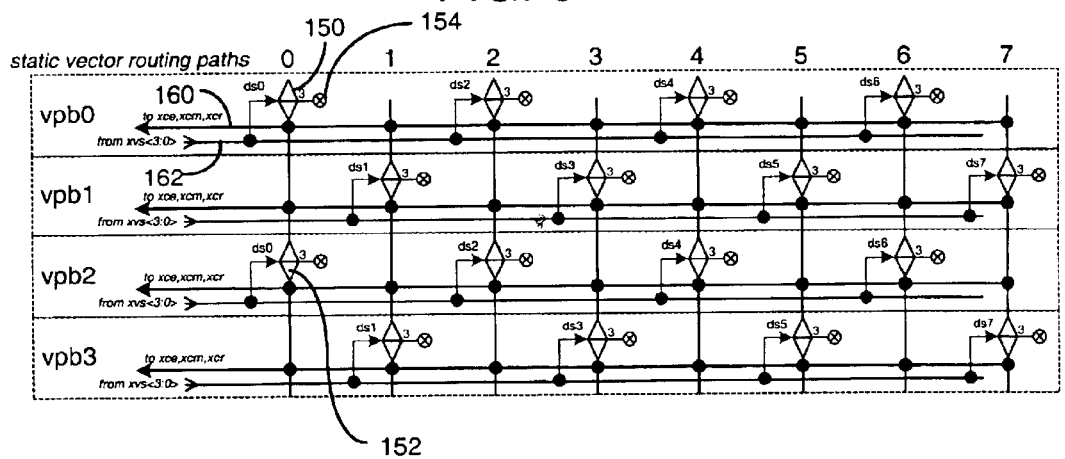
FIG. 8 is a detailed circuit diagram showing static vector routing paths of FIG. 4.
Figure 9:
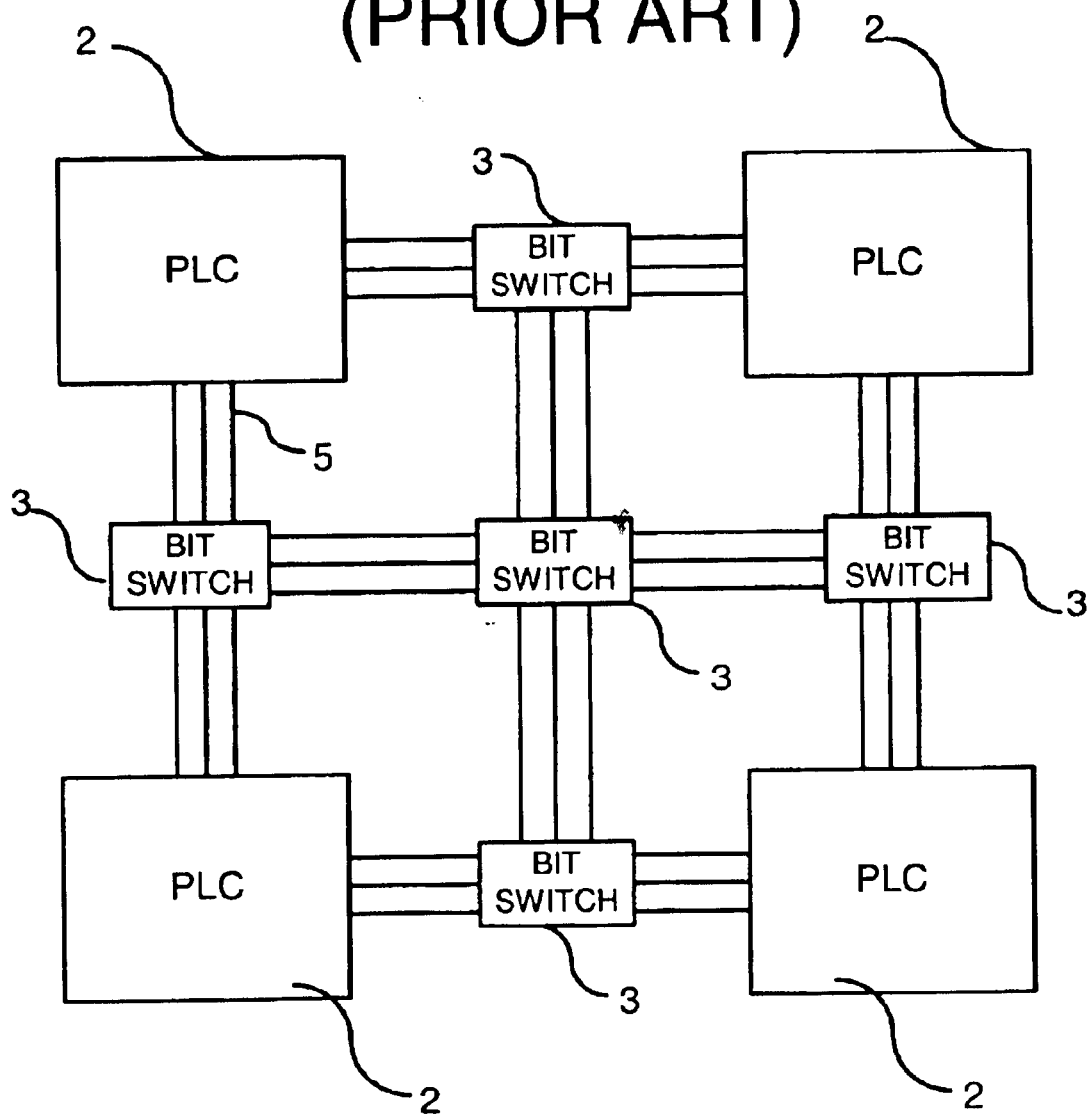
FIG. 9 is a prior art representation of a portion of an FPGA.

FIG. 8 is a detailed circuit diagram of the static vector routing column 92 having eight vector routing paths (labeled 0–7). Although not shown, each vector routing path is a group of wires (8, 16, 32, . . . etc.) used to carry a vector signal. Additionally, for simplicity, only four VPBs (VPB0-VPB3) are shown coupled to the static vector routing column. Each vector routing path has multiple active repeater drivers associated with it to drive and terminate signals on the vector routing paths. For example, vector routing path 0 has drivers 150, 152 coupled thereto. The drivers are statically controlled by fuses shown generally at 154. However, dynamic control of the drivers may be added by simply coupling dynamically controllable signals directly to the drivers in place of the fuses. The static column drivers are repeaters that can be configured to drive different sources to different segment directions on the bi-directional static column bus. Each repeater may be configured to drive a signal from one of three different sources: from the current VPB, from the lower column segment and from the upper column segment. When the repeater is switched off, the segments above and below can be used to carry different signals, thus reusing the vertical column for multiple channels. Thus, the repeater can be configured into the following modes: (0) drive upper to lower segment; (1) drive lower to upper segment; (2) drive data from a VPB to a lower segment; (3) drive data from a VPB to an upper segment; (4) drive data from a VPB to both upper and lower segments; (5) keep segmentation off. Data is received from the vector routing paths 0–7 on the input vector 160 to VPB0. Additionally, VPB0 supplies data to any of the vector routing paths via the output vector 162.

Thus, a programmable logic architecture is defined that optimizes vector-based functions that are common requirements in today's DSP algorithms. This should result in a lower cost, higher performance solution for vector-based functions than is achievable with previous bit-oriented FPGA architectures.

Having illustrated and described the principles of the illustrated embodiments, it will be apparent to those skilled in the art that the embodiments can be modified in arrangement and detail without departing from such principles. Although a particular structure is shown for the PLD, a wide variety of PLD layouts may be used. Additionally, although the vector routing is generally shown in columns, it may be used in rows.

The invention may also be applied to volatile memory devices.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

We Claim:

1. A programmable logic device (PLD), comprising:
a first programmable component;
a second programmable component; and
a vector routine path coupling the first component to the second component, the vector routine path including a group of wires for routine a group of bits as one vector so that all bits in the vector are switched at once and as a group by a single set of control signals; and
an interface between the first and second components to convert between the vector domain and the PLD domain.

2. A programmable logic device (PLD), comprising:
a first programmable component;
a second programmable component; and
a vector routing path coupling the first component to the second component, the vector routine path including a group of wires for routing a group of bits as one vector so that all bits in the vector are switched at once and as a group) by a single set of control signals, wherein the vector routing path is time-division multiplexed so that it may be used by different components at different periods of time.

3. A programmable logic device (PLD), comprising:
a first programmable component;
a second programmable component;
a vector routing oath coupling the first component to the second components, the vector routing path including a group of wires for routing a group of bits as one vector so that all bits in the vector are switched at once and as a group by a single set of control signals;
component; and
a multiplexer coupled to the first, second, and third components to dynamically switch the coupling of the first component to either of the second and third components.

4. A programmable logic device (PLD), comprising:
a first programmable component;
a second programmable component; and
a vector routing path coupling the first component to the second component, the vector routine path including a group of wires for routing a group of bits as one vector so that all bits in the vector are switched at once and as a group by a single set of control signals, wherein the vector routing path includes multiple wires in parallel with a tristate gate associated with each wire to allow for time division multiplexing of the vector routing path.

5. A programmable logic device (PLD), comprising:
a first programmable component;
a second programmable component;
a vector routing path coupling the first component to the second component, the vector routing path including a group of wires for routine a group of bits as one vector so that all bits in the vector are switched at once and as a group by a single set of control signals; and
a bus keeper coupled to the vector routing path to hold the vector routing path at its current voltage level.

6. A programmable logic device (PLD), comprising:
a first programmable component;
a second programmable component; and
a vector routing path coupling the first component to the second component, the vector routing path including a group of wires for routing a group of bits as one vector so that all bits in the vector are switched at once and as a group by a single set of control signals, wherein the vector routing path includes multiple wires in parallel with a driver associated with each wire that can control the direction that the signal is driven on the wire.

7. A method of connecting components in a programmable logic device, comprising:
routing between components in the programmable logic device using a vector routing path that includes a group of wires that carry multiple bits that are controlled as a group by a single set of control signals and that have a fixed-bit ordering maintained; and
time-division multiplexing signals on the vector routing path so that the vector routing path is shared by multiple components.

8. A field programmable gate array (FPGA), comprising:
multiple programmable logic cells that perform operations on a bit-by-bit basis in an FPGA domain;
at least two vector processing blocks coupled to one or more of the programmable logic blocks, the vector processing blocks including one or more engines operable to process data and perform operations on data in fixed-width vectors;
a vector routing path coupled between the vector processing blocks; and
at least one multiplexer coupled to at least one engine in a vector processing block, the multiplexer dynamically switching vector sources coupled to the at least one engine.

9. A field programmable gate array (FPGA), comprising:
multiple programmable logic cells that perform operations on a bit-by-bit basis in an FPGA domain;
at least two vector processing blocks coupled to one or more of the programmable logic blocks, the vector processing blocks including one or more engines operable to process data and perform operations on data in fixed-width vectors;
a vector routing path coupled between the vector processing blocks; and
at least one switch along the length of a vector routing path to allow time-division multiplexing of the vector routing path.

10. The PLD of claim 1, wherein the first component includes two or more programmable logic cells within a PLD domain with signals switched and routed on a bit-by-bit basis and the second component is in a vector domain and operates on vectors.

11. The PLD of claim 2, wherein the first component and the second component both operate on vectors.

12. The PLD of claim 2, wherein the vector routing path is dynamically segmented.

13. The PLD of claim 2, wherein the vector routing path is statically segmented.

14. The PLD of claim 1, wherein the vector routing path includes multiple wires in parallel with pass gates associated with each wire to allow for segmentation of the vector routing path.

15. The PLD of claim 2, further including a vector switch box coupled between the first and second components, the vector switch box switching a vector with a single set of control lines while maintaining a fixed-bit order of the vector.

16. The method of claim 7, wherein at least one of the components performs a logic operation on a vector signal on the vector routing path and wherein the logic operation is one of the following: a multiply or an addition.

17. The method of claim 7, further including dynamically or statically segmenting the vector routing path.

18. The method of claim 7, wherein at least one of the components is an engine that performs operations on vectors, and further including dynamically reconfiguring which other components are a source for providing a vector to the engine.

19. The method of claim 7, wherein the programmable logic device is a field programmable gate array.

20. The field programmable gate array of claim 8, further comprising at least one switch along the length of a vector routing path to allow segmentation of the vector routing path.

21. The circuit of claim 1, wherein the first component and the second component both operate on vectors.

22. The circuit of claim 2, wherein the first component includes two or more programmable logic cells within a PLD domain with signals switched and routed on a bit-by-bit basis and the second component is in a vector domain and operates on vectors.

23. The circuit of claim 1, wherein the vector routing path is dynamically segmented.

24. The circuit of claim 1, wherein the vector routing path is statically segmented.

25. The circuit of claim 2, wherein the vector routing path includes multiple wires in parallel with pass gates associated with each wire to allow for segmentation of the vector routing path.

26. The circuit of claim 1, further including a vector switch box coupled between the first and second components, the vector switch box switching a vector with a single set of control lines while maintaining a fixed-bit order of the vector.

27. The FPGA of claim 9, wherein the at least one switch along the length of the vector routing path is configured to allow segmentation of the vector routing path.

* * * * *

UNITED STATES PATENT AND TRADEMARK OFFICE
CERTIFICATE OF CORRECTION

PATENT NO. : 6,812,738 B1
DATED : November 2, 2004
INVENTOR(S) : Conrad Dante et al.

It is certified that error appears in the above-identified patent and that said Letters Patent is hereby corrected as shown below:

Column 8,
Lines 35, 36, 37 and 47, "routine" should be -- routing --.
Line 63, "component" should be -- a third component --.

Column 9,
Lines 5 and 18, "routine" should be -- routing --

Signed and Sealed this

Seventeenth Day of May, 2005

JON W. DUDAS
*Director of the United States Patent and Trademark Office*